United States Patent
Nakagawa

(10) Patent No.: US 8,073,316 B2
(45) Date of Patent: Dec. 6, 2011

(54) OVEN FOR SEMICONDUCTOR WAFER

(75) Inventor: Seiji Nakagawa, Oita (JP)

(73) Assignee: Kabushiki Kaisha Toshiba, Minato--ku, Tokyo (JP)

( * ) Notice: Subject to any disclaimer, the term of this patent is extended or adjusted under 35 U.S.C. 154(b) by 855 days.

(21) Appl. No.: 12/023,344

(22) Filed: Jan. 31, 2008

(65) Prior Publication Data

US 2009/0196588 A1 Aug. 6, 2009

(51) Int. Cl.
*A21B 2/00* (2006.01)
*C23C 16/00* (2006.01)

(52) U.S. Cl. ........................................ 392/416; 118/725

(58) Field of Classification Search .......... 392/407–440; 219/405, 406–474; 118/724, 725–732

See application file for complete search history.

(56) References Cited

U.S. PATENT DOCUMENTS

| | | | | |
|---|---|---|---|---|
| 6,002,109 A * | 12/1999 | Johnsgard et al. | ............. | 219/390 |
| 6,043,460 A * | 3/2000 | Johnsgard et al. | ............. | 219/390 |
| 6,172,337 B1 * | 1/2001 | Johnsgard et al. | ............. | 219/390 |
| 6,191,394 B1 * | 2/2001 | Shirakawa et al. | ........ | 219/444.1 |
| 6,403,925 B1 * | 6/2002 | Johnsgard et al. | ............. | 219/390 |
| 6,403,933 B1 * | 6/2002 | Strodtbeck et al. | ............. | 219/502 |
| 2007/0125762 A1 * | 6/2007 | Cui et al. | ................... | 219/444.1 |

FOREIGN PATENT DOCUMENTS

JP 2001274069 10/2001

* cited by examiner

*Primary Examiner* — Daniel L Robinson
(74) *Attorney, Agent, or Firm* — Banner & Witcoff, Ltd.

(57) ABSTRACT

An oven is described that can more evenly heat the semiconductor wafer, even though the wafer may warp during heating. The oven may provide relatively uniform heating even though the type and location of warping may be unpredictable for any given wafer. The oven may have a heating surface divided into a plurality of heating zones that may each independently provide a given amount of heat to the wafer. The amount of heat provided by each zone may be determined using signals from sensors that sense the warping of the wafer.

5 Claims, 5 Drawing Sheets

OVEN FOR SEMICONDUCTOR WAFER

BACKGROUND

Semiconductor lithography wafers are typically placed in an oven module for baking, usually after lithographical exposure. Although important to the manufacturing process, such post-exposure baking can cause problems if the wafer is not uniformly heated. During baking, the wafer will often warp in an unpredictable manner. Such warping leads to non-uniform heating, since some portions of the wafer may be closer to the heating element than other portions of the wafer. Non-uniform heating of the wafer can cause problems with the final product, such as the creation of non-uniform circuitry features.

SUMMARY

There is a need for an oven that can more evenly heat the semiconductor wafer, even though the wafer may warp during heating. Such an oven may be able to provide relatively uniform heating even though the type and location of warping may be unpredictable for any given wafer. For example, warping may be concave or convex, and may occur in one or more locations. In addition to providing more uniform heating, the application of additional heat to portions of the wafer may actually cause the wafer to at least partially un-warp back to straighter profile. Such an oven may allow for more of a wafer to be utilized in the final product, thereby reducing manufacturing costs and increasing efficiency.

The oven may have a heating surface that is divided into a plurality of heating zones that may each independently provide a given amount of heat to the wafer. The amount of heat provided by each zone may be determined using signals from sensors that sense the warping of the wafer. In real time, the amount of heat for one or more of the zones may be adjusted to account for the wafer warping. For instance, if it is sensed that the wafer is moving further away from a zone, then that zone may increase the amount of heat to account for the increased gap between the surface of the zone and the wafer.

A controller may be implemented that controls how much heat is provided by each zone. The controller thus receives signals from the sensors and outputs command signals to each zone to provide a given amount of heat. The signals may be analog or digital, and they may be sent over separate conductors and/or multiplexed onto one or more shared conductors. The amount of heat provided by each zone may be completely independent of the amount of heat provided by other zones, or it may depend upon the amount of heat of another zone or zones, such as a neighboring zone.

These and other aspects of the invention will be apparent upon consideration of the following detailed description of illustrative embodiments.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein.

DETAILED DESCRIPTION OF ILLUSTRATIVE EMBODIMENTS

Figure 1:
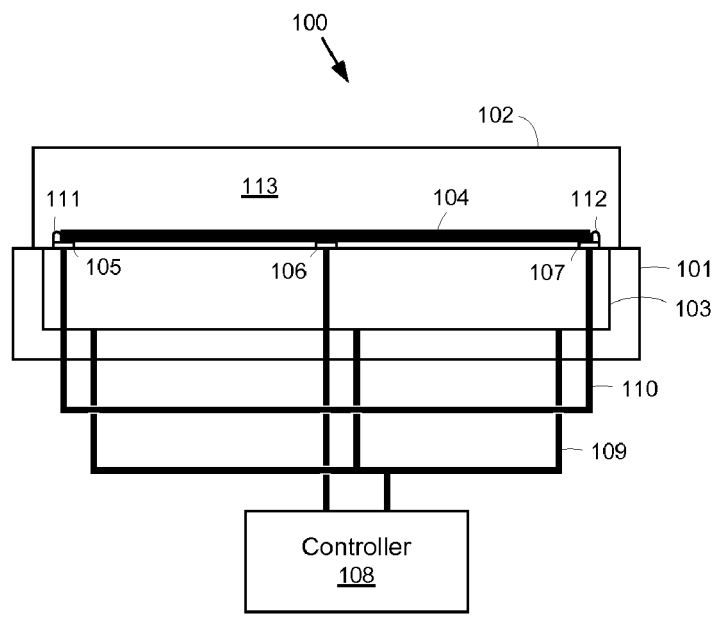
FIG. 1 is a combined side view and functional block diagram of an illustrative oven.
Figure 2:
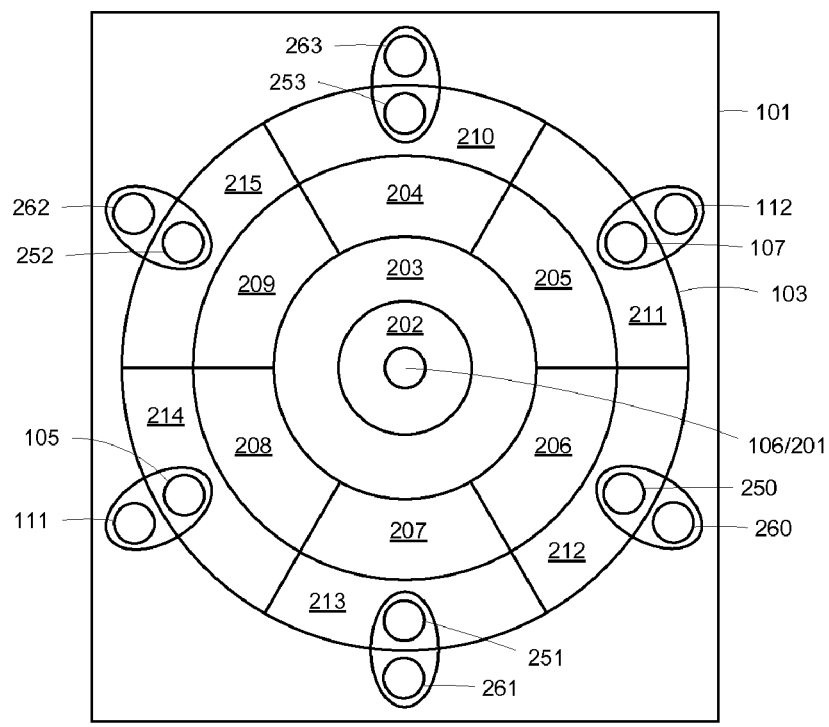
FIG. 2 is a top plan view of the oven of FIG. 1.

Referring to FIGS. 1 and 2, an illustrative embodiment of an oven 100 is shown. Oven 100 includes a base 101 and a cover 102. When base 101 and cover 102 are coupled together as shown, they form a hollow cavity 113 into which a semiconductor wafer 104 may be placed. Although not shown, a door or other opening may be provided to allow semiconductor wafer 104 to be placed into cavity 113.

Semiconductor wafer 104, once disposed in cavity 113, would be arranged to as to rest on or near a surface, referred to herein as a heating portion 103. Heating portion 103 is configured to apply heat to semiconductor wafer 104. Heating portion 103 is divided into a plurality of heating zones 201-215, which may be able to provide different amounts of heat independently of each other. Heating zones 201-215 are controlled by a controller 108, which provides heating command signals to heating zones 201-215 via conductive signal paths 109, such as wires. Controller 108 may control the amount of heat provided by each heating zone 201-215 in accordance with a pre-determined setting and/or in accordance with signals provided by one or more of a plurality of sensors 105, 106, 107, 250, 251, 252, 253. The signals provided by sensors 105-107, 250-253 are conveyed to controller 108 via conductive signal paths 110, such as wires.

Controller 108 may be any type of controller, such as a microprocessor, a digital circuit, and/or an analog circuit. Controller 108 may be embodied as a separate integrated circuit chip, it may be embodied as a set of discrete components, and/or it may be part of a larger circuit.

Heating zones 201-215 may each be embodied as any type of heating element, such as a resistive heating element or other known type of heating element. A resistive heating element produces heat from a resistor through which electrical current is passed. Although FIG. 2 shows that oven 100 has fifteen heating zones 201-215, any number of a plurality of heating zones may be used. A particular layout of heating zones 201-215 is shown in FIG. 2; in the illustrative embodiment, heating zone 201 is located at the center of a circle, and heating zones 202-215 are disposed in concentric rings around central heating zone 201. Also, heating zones 201-215 are laid out in a circular symmetrical pattern. This is because semiconductor wafer 104 is generally a symmetrical circular plate. However, any layout of heating zones may be used, and any shape of semiconductor wafer may be used.

A plurality of stops 110, 112, 260, 261, 262, 263 protrude upward away from base 101 and serve to define the boundary of the region in which semiconductor wafer 104 should be placed during heating. In this example, stops 110, 112, 260-263 are arranged in a circular pattern due to the circular shape of semiconductor wafer 104, such that semiconductor wafer 104 just fits within the area defined by the circular pattern. Stops 110, 112, 260-263 may also help prevent semiconductor wafer 104 from sliding due to any warping that may occur due to the heating of semiconductor wafer 104.

Figure 8:
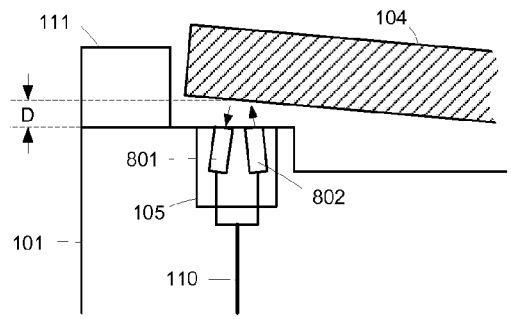
FIG. 8 is a side cut-away view of a portion of the oven of FIG. 1 where a sensor is an illustrative optical sensor.

Sensors 105-107 and 250-253 are used to determine whether and where a warping occurs in semiconductor wafer 104 during heating. For instance, if semiconductor wafer 104 warps upward (away from heating portion 103) at a location over or otherwise near sensor 105, then sensor 105 would detect that a gap D (as shown in FIG. 8, for example) exists or has increased due to the warp between semiconductor wafer 104 and heating portion 103 at a particular location. If semiconductor wafer 104 then relaxes or warps back downward at the same location, then sensor 105 would detect that gap D no longer exists or has decreased. As will be discussed next, detecting such warping provides feedback information to oven 100 to customize heat distribution throughout heating portion 103 to reduce or even minimize warping of semiconductor wafer 104.

Figure 3:
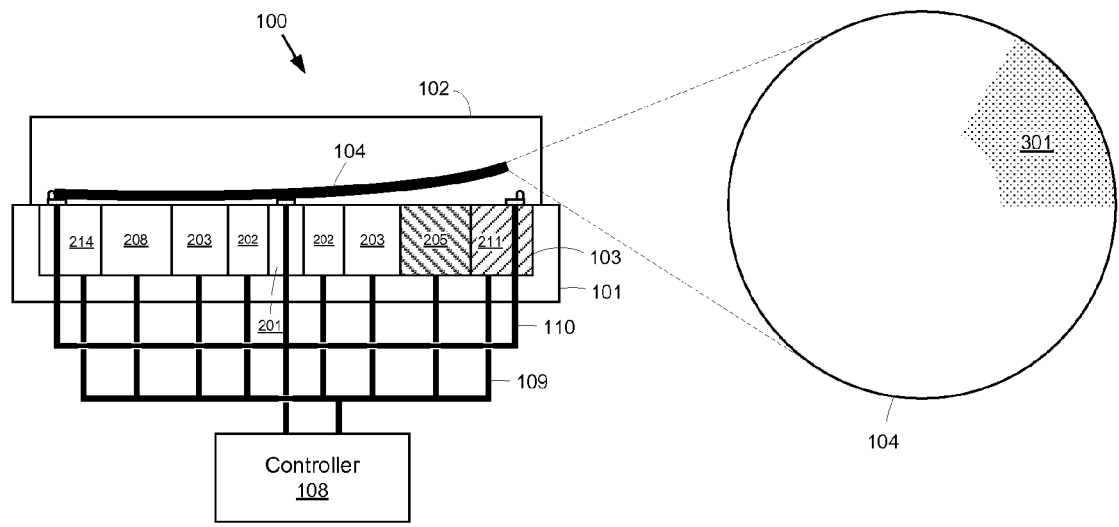
FIG. 3 is another combined side view and functional block diagram of the oven of FIG. 1, showing differences in the amount of heat provided by various illustrative heating zones.

Various situations involving warping of semiconductor wafer 104 will now be discussed. Referring to FIG. 3, during heating, a portion 301 of semiconductor wafer 104 is shown to warp upward away from heating portion 103. Thus, semiconductor wafer 104 has effectively developed a concave warp. In this example, warped portion 301 is approximately a quadrant of circular semiconductor wafer 104 as roughly indicated on the right-hand side of FIG. 3 (showing a top plan view of semiconductor wafer 104). The drawings herein are not necessarily to scale, and warping as shown in these drawings may be exaggerated.

As semiconductor wafer 104 warps in FIG. 3, sensor 107 detects the pulling away of warped portion 301 of semiconductor wafer 104. Sensor 107 (and any other of sensors 105, 106, 250-253) may detect this in any of a number of ways. For example, sensors 105-107, 250-253 may be an optical sensor, a vacuum sensor, a pressure sensor, or any other sensor that is able to detect warping of semiconductor wafer 104.

Figure 4:
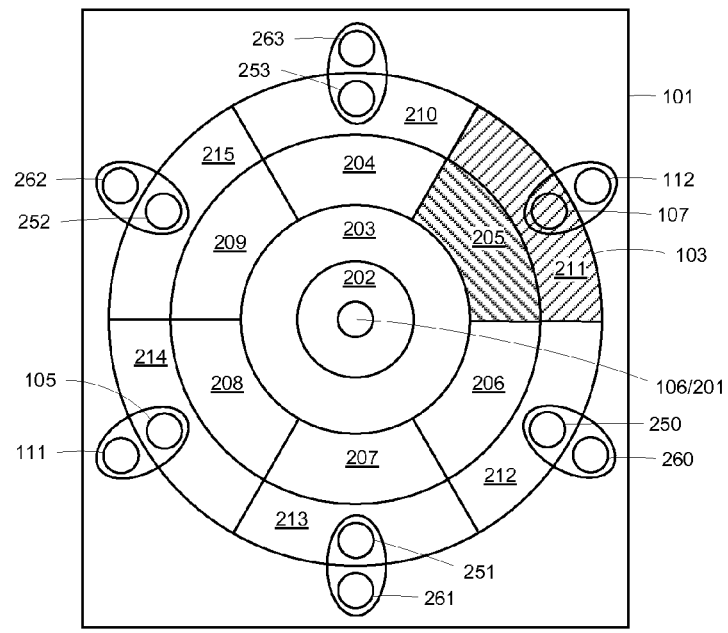
FIG. 4 is another top plan view of the oven of FIG. 1, showing the illustrative differences in the amount of heat provided by various heating zones as in FIG. 3.

Referring to FIG. 4, responsive to sensor 107 detecting warping of warped portion 301 upward away from sensor 107, a signal is sent from sensor 107 to controller 108 indicating this condition. In response to the signal, controller 108 may cause one or more of heating zones 201-215 to adjust the amount of heat generated, as appropriate. In this case, since the signal from sensor 107 indicates that warped portion 301 is further away from sensor 107, controller 108 may determine that it is appropriate to cause heating zones 205 and 211 to increase the amount of heat generated. Because sensor 107 is near the perimeter of semiconductor wafer 104, it may be assumed that the gap between semiconductor wafer 104 and perimeter heating zone 211 is slightly larger than the gap between semiconductor wafer 104 and heating zone 205, which is further inward toward the center. Accordingly, heating zone 211 may be commanded to generate even more heat than the heat generated by heating zone 205. This differential is indicated in FIG. 4 by way of cross-hatch marks. In FIG. 4, no cross-hatch marks represents a normal amount of heat, reverse cross-hatch marks (as shown in heating zone 205) represents a first amount of heating that is greater than the normal heating amount, and forward cross-hatch marks (as shown in heating zone 211) represents a second amount of heating that is still greater than the first amount of heating. Such cross-hatch mark representations are also shown in the side view of FIG. 3.

Figure 5:
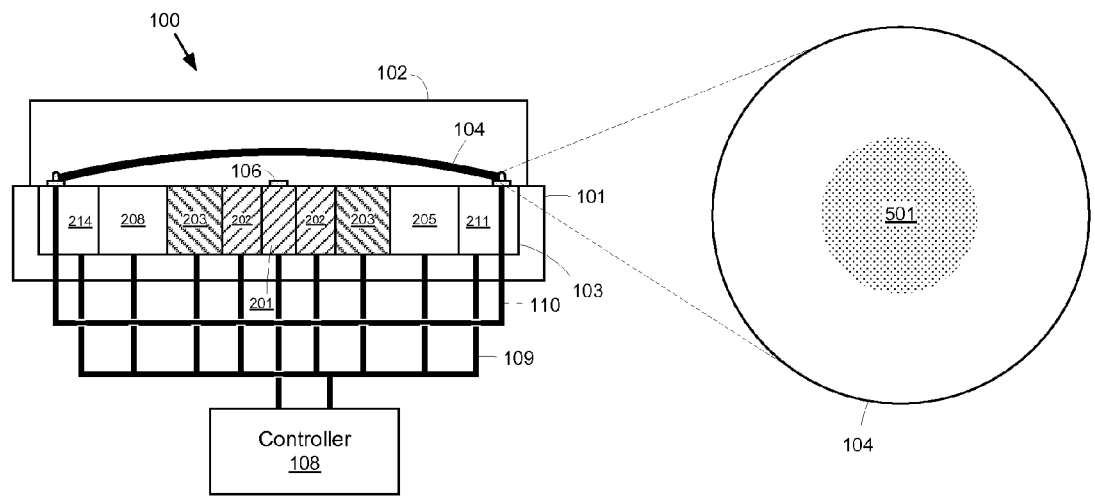
FIG. 5 is another combined side view and functional block diagram of the oven of FIG. 1, showing differences in the amount of heat provided by various illustrative heating zones.
Figure 6:
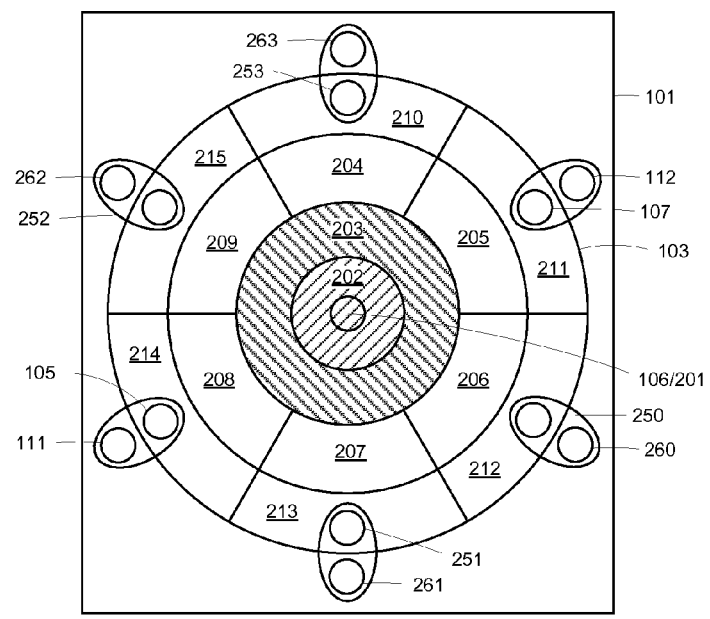
FIG. 6 is another top plan view of the oven of FIG. 1, showing the illustrative differences in the amount of heat provided by various heating zones as in FIG. 5.

Another example of a warping of semiconductor wafer 104 is shown with reference to FIGS. 5 and 6. Here, semiconductor wafer 104 has developed a convex warp, because a central portion 501 has warped upward away from heating zones 201-215. Because of this warp, at least sensor 106 detects the relatively large gap between sensor 106 and semiconductor wafer 104, and in response generates a signal that causes heating zones 201, 202, and 203 to increase their respective heat outputs. The increased heat output accounts for the increased gap between a respective heating zone and the overlying portion of semiconductor wafer 104. Because, in this example, semiconductor wafer 104 is warped such that it has a greater gap D near the center (as measured by sensors 105-107 and 250-253), heating zones 201, 202, 203 may not increase their respective heat outputs to the same amount. In this example, the gap is larger over heating zones 201 and 202, and so heating zones 201 and 202 increase their respective heat outputs by the largest amount, as indicated in FIGS. 4 and 5 by forward cross-hatch marks. And, since gap D is relatively smaller over heating zone 203, the heat output for heating zone 203 is increased by a relatively smaller amount, as indicated in FIGS. 4 and 5 by reverse cross-hatch marks. The remaining heating zones in this example, may continue to output a default, or normal, amount of heat, since gap D is relatively small or non-existent over these heating zones.

It can therefore be seen that the particular heating zones that are adjusted to provide greater (or lesser) heat depends upon which portions of semiconductor wafer 104 are warped away from the heating zones. In addition, the amount of adjustment that is made may also depend upon the amount and location of the warp. For instance, where sensors 105-107, 250-253 are each able to determine not only whether a gap (or increased gap) exists, but also the extent of the gap. In such a case, the amount of heat increase of a given zone may be smaller for a smaller gap and larger for a larger gap. In addition, heat output patterns may be defined to be associated with sensed gap patterns. For example, if a relevant gap is sensed at first given set of sensors but a relevant gap is not sensed at a second given set of sensors, then the heat outputs for each of heating zones 201-215 may be pre-defined in a look-up table for that given sensed input.

Figure 7:
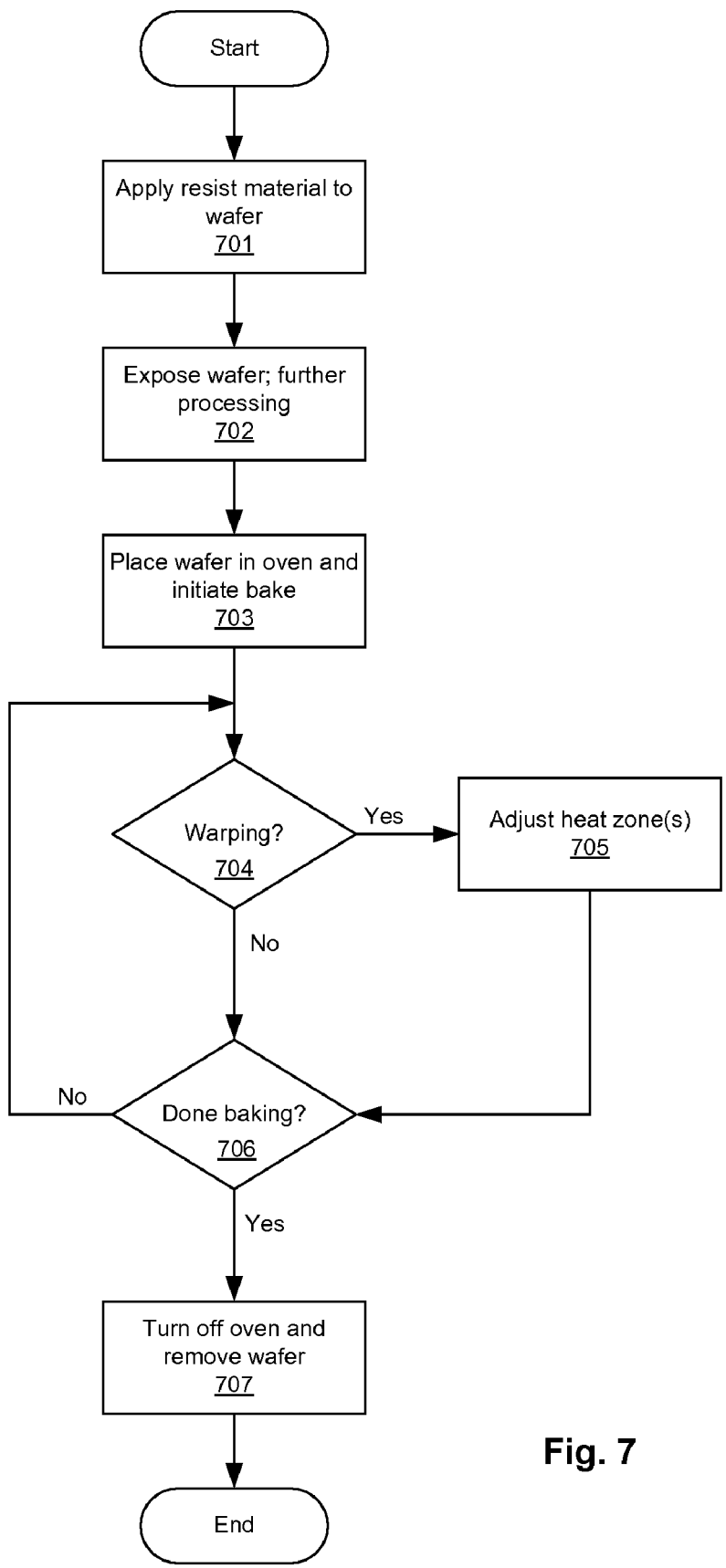
FIG. 7 is a flowchart showing illustrative steps that may be taken to process a semiconductor wafer including post-exposure bake with feedback-driven heat.

Referring to FIG. 7, an illustrative process is shown for preparing and baking semiconductor wafer 104. In step 701, a resist material is blanketed over semiconductor wafer 104. In step 702, semiconductor wafer 104 is exposed to patterned light or other radiation that interacts with the resist material, and further processing is performed such as removing the exposed or non-exposed portion of the resist material. Next, in step 703, exposed semiconductor wafer 104 is placed in oven 100, and baking is initiated. In step 704, it is sensed whether there is any warping of semiconductor wafer 104. If so, one or more of heat zones 201-215 are adjusted to provide more or less heat as appropriate such that semiconductor wafer 104 will be heated more uniformly than in conventional ovens. In step 706, if baking is not completed, then steps 704-706 are repeated until baking is complete. Note that while steps 704-706 are shown as discrete steps, these steps may be performed continuously and simultaneously with each other. Once baking is complete, the oven is turned off or otherwise disabled in step 707.

Figure 9:
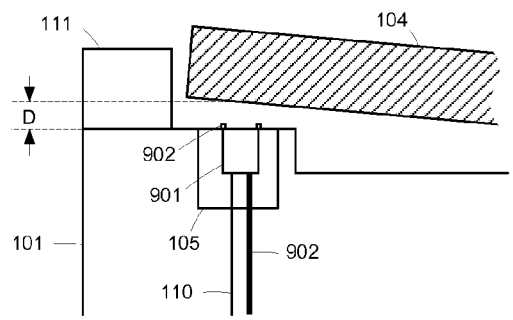
FIG. 9 is a side cut-away view of a portion of the oven of FIG. 1 where a sensor is an illustrative vacuum sensor.
Figure 10:
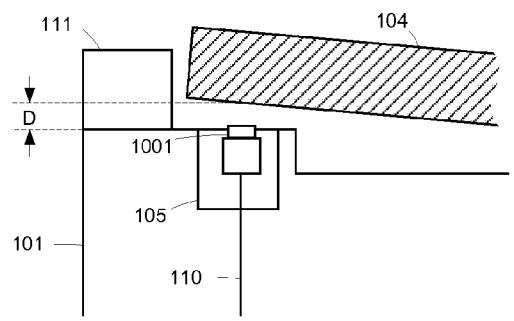
FIG. 10 is a side cut-away view of a portion of the oven of FIG. 1 where a sensor is an illustrative pressure sensor.

FIGS. 8-10 show various illustrative types of sensors that may be used in oven 100, where sensor 105 is referred to as an example. However, any of the sensors may be configured as discussed. Referring to FIG. 8, sensor 105 is shown as an optical sensor, having a light transmitter 802 and a light receiver 801. In this example, light is transmitted by light transmitter 802 as a tight beam or as diffuse light up toward semiconductor wafer 104. The light may then be reflected by a particular amount, or not reflected at all, depending upon a position of semiconductor wafer 104 relative to sensor 105.

Referring to FIG. 9, sensor 105 is shown as a vacuum sensor, having a tube 902 that provides a vacuum generated by a pump (not shown) to an opening 901. When semiconductor wafer 104 is in contact with opening 901, a seal may be made with the help of a gasket 902, thereby maintaining the vacuum. However, if semiconductor wafer 104 moves up away from opening 901, as shown, then the vacuum will not be maintained as well and this pressure change may be sensed.

Referring to FIG. 10, sensor 105 is shown as a pressure sensor, having a button 1001 or other surface that senses the presence and/or absence of downward pressure. Thus, sensor 105 can sense the difference between when semiconductor wafer 104 is resting on button 1001 and when it is not.

Thus, an improved oven, such as a semiconductor wafer post-exposure bake oven, has been described. Using such an oven with automatically adjustable heat zones, the semiconductor wafer may be more uniformly heated than in conventional ovens. This may allow more of the semiconductor wafer to be used in the final product, thereby increasing manufacturing efficiency and lowering manufacturing costs.

What is claimed is:

1. An apparatus for heating a semiconductor wafer, comprising:
    a heating surface including a first heating zone configured to provide a first amount of heat and a second heating zone configured to provide a second amount of heat;
    a first sensor configured to generate a first signal based on a proximity of the wafer to the first sensor;
    a second sensor configured to generate a second signal based on a proximity of the wafer to the second sensor; and
    a controller configured to control the first amount of heat provided by the first heating zone based on the first signal and to control the second amount of heat provided by the second heating zone based on the second signal, wherein the heating surface further includes a third heating zone configured to provide a third amount of heat and a fourth heating zone configured to provide a fourth amount of heat, wherein the controller is further configured to control the third amount of heat based on the first signal and to control the fourth amount of heat based on the second signal, and wherein the third amount of heat is different from the first amount of heat and the fourth amount of heat is different from the second amount of heat.

2. The apparatus of claim 1, wherein the controller is further configured to adjust the first amount of heat based on a change in the first signal and to adjust the second amount of heat based on a change in the second signal.

3. The apparatus of claim 1, wherein each of the first and second sensors is a pressure sensor.

4. The apparatus of claim 1, wherein each of the first and second sensors is an optical sensor.

5. The apparatus of claim 1, wherein each of the first and second sensors is a vacuum sensor.

* * * * *